US007042226B2

(12) United States Patent
Laig-Hoerstebrock et al.

(10) Patent No.: US 7,042,226 B2
(45) Date of Patent: May 9, 2006

(54) METHOD FOR DETERMINING THE WEAR TO A STORAGE BATTERY, AND A MONITORING DEVICE

(75) Inventors: Helmut Laig-Hoerstebrock, Frankfurt (DE); Eberhard Meissner, Wunstorf (DE); Wilfried Tautenhahn, Wunstorf (DE)

(73) Assignee: VB Autobatterie GmbH, Hannover (DE)

( * ) Notice: Subject to any disclaimer, the term of this patent is extended or adjusted under 35 U.S.C. 154(b) by 229 days.

(21) Appl. No.: 10/692,891

(22) Filed: Oct. 24, 2003

(65) Prior Publication Data

US 2004/0135582 A1 Jul. 15, 2004

(30) Foreign Application Priority Data

Oct. 26, 2002 (DE) .................... 102 49 921

(51) Int. Cl.
*G01N 27/416* (2006.01)
(52) U.S. Cl. .................. 324/427; 320/132; 320/134
(58) Field of Classification Search ............. 324/427
See application file for complete search history.

(56) References Cited

U.S. PATENT DOCUMENTS 4,553,081 A * 11/1985 Koenck .................. 320/131
6,534,954 B1 * 3/2003 Plett ...................... 320/132
2002/0101218 A1 * 8/2002 Koenck et al. ........... 320/140
2005/0001627 A1 * 1/2005 Anbuky et al. ........... 324/427

FOREIGN PATENT DOCUMENTS

| DE | 38 08 559 A1 | 9/1989 |
| DE | 39 01 680 A1 | 3/1990 |
| DE | 195 40 827 A1 | 5/1996 |
| DE | 19540827 A1 * | 5/1996 |
| DE | 101 58 029 A1 | 6/2002 |

* cited by examiner

*Primary Examiner*—Karl D. Easthom
*Assistant Examiner*—Aaron Piggush
(74) *Attorney, Agent, or Firm*—Foley & Lardner LLP

(57) ABSTRACT

A method for determining the wear to a storage battery by monitoring the state of charge of the storage battery includes identifying a plurality of deep discharge events when a state of charge value for the storage battery is less than a minimum state of charge value specified for the storage battery. The method also includes determining the duration of the plurality of deep discharge events and determining a wear variable which characterizes the wear as a function of the total number and the total duration of the plurality of deep discharge events. The wear variable increases as the total number and the total duration of the deep discharge events increases. A monitoring device comprising a measurement unit and an evaluation unit that is configured to use the method may be provided. A computer program having computer program means designed to carry out the method may also be provided.

24 Claims, 1 Drawing Sheet

METHOD FOR DETERMINING THE WEAR TO A STORAGE BATTERY, AND A MONITORING DEVICE

CROSS-REFERENCE TO RELATED PATENT APPLICATIONS

Germany Priority Application DE 102 49 921.7, filed Oct. 26, 2002 including the specification, drawings, claims and abstract, is incorporated herein by reference in its entirety.

BACKGROUND

The present invention relates to a method for determining the wear to a storage battery by monitoring the state of charge of the storage battery. The invention also relates to a monitoring device and a computer program for carrying out such a method.

As the life of batteries (e.g., rechargeable storage batteries or electrochemical energy stores) increases, wear occurs. In particular, wear occurs during discharging and charging of the batteries. In addition to discharging and charging, there are also operating conditions which accelerate the wear. These include, for example, the total operating life for a lead-acid rechargeable battery, which is the total time that has passed since it was first used, including those periods in which the rechargeable battery had no electrical load applied to it.

Furthermore, increased temperatures can exacerbate the wear during the periods when no electrical load is applied, and can exacerbate the wear caused by cyclic discharging and charging.

For use of storage batteries, it is desirable to determine the wear on the basis of the loss of storage capacity. However, in this case, the complexity of the processes that take place in a storage battery represents a problem which can be described only with difficulty using scientific methods.

By way of example, DE 195 40 827 C2 discloses an empirical method for determining the state of aging of a storage battery, in which a battery-specific family of characteristics is predetermined for battery aging. A battery aging value is determined with the aid of the family of characteristics, by detection of instantaneous values of the battery aging influencing variables for the storage battery being monitored.

DE 39 01 680 C3 discloses a method for monitoring the cold starting capability of a starter battery, in which the charge voltage is continuously observed when the internal combustion engine is running, and is monitored for exceeding or undershooting predetermined limit values. This makes it possible to identify a generator defect. Furthermore, the time profile of the voltage drop at the connecting terminals of the electrical starter is observed and evaluated during the starting process. However, it is difficult to characterize the available storage capacity of the storage battery using such a method.

DE 38 08 559 C2 discloses a method for monitoring the power limit of a starter battery, in which an amount of charge balance is produced by adding up the amounts of charge which have flowed into and out of the battery. The state of charge of the starter battery is assessed from this, in conjunction with the monitoring of a limiting terminal voltage and the temperature. It is also difficult to characterize the remaining maximum storage capacity of the battery in this case.

DE 101 58 029 A1 discloses a method for calculating a dynamic state of charge of a storage battery, in which correction factors are taken into account for various operating conditions relating to the current, temperature, and state of charge. Test cycles are carried out in which the storage battery is completely discharged. The number of test cycles and the average decrease in capacity per discharge cycle are determined and used to calculate a state of charge value. The capacity of the storage battery is increased by discharging it completely.

It would thus be advantageous to provide a method for determining the wear to a battery by monitoring the state of charge of the battery, by means of which a wear variable can be calculated by relatively reliable and simple means as a measure of the loss of storage capacity. It would also be advantageous to provide a monitoring device for use with a battery for determining the wear of the battery. It would also be advantageous to provide a system such as a computer program for determining the wear of the battery.

It would be advantageous to provide a method or system or the like of a type disclosed in the present application that provides any one or more of these or other advantageous features.

SUMMARY

An exemplary embodiment relates to a method for determining the wear to a storage battery by monitoring the state of charge of the storage battery. The method includes identifying a plurality of deep discharge events when a state of charge value for the storage battery is less than a minimum state of charge value specified for the storage battery. The method also includes determining the duration of the plurality of deep discharge events and determining a wear variable which characterizes the wear as a function of the total number and the total duration of the plurality of deep discharge events. The wear variable increases as the total number and the total duration of the deep discharge events increases.

Another exemplary embodiment relates to a monitoring device for storage batteries. The monitoring device includes a measurement unit for measuring variables which characterize the state of charge of the storage battery and an evaluation unit for determining the state of charge of the storage battery from the measured variables and for determining the wear of the storage battery using a method. The method includes identifying a plurality of deep discharge events when a state of charge value for the storage battery is less than a minimum state of charge value specified for the storage battery. The method also includes determining the duration of the plurality of deep discharge events and determining a wear variable which characterizes the wear as a function of the total number and the total duration of the plurality of deep discharge events. The wear variable increases as the total number and the total duration of the deep discharge events increases.

Another exemplary embodiment relates to a computer program that includes program code means. The program code means are designed to carry out a method that includes identifying a plurality of deep discharge events when a state of charge value for the storage battery is less than a minimum state of charge value specified for the storage battery. The method also includes determining the duration of the plurality of deep discharge events and determining a wear variable which characterizes the wear as a function of the total number and the total duration of the plurality of deep discharge events. The wear variable increases as the total number and the total duration of the deep discharge events increases.

BRIEF DESCRIPTION OF THE DRAWINGS

The invention will be explained in more detail in the following text with reference to the attached drawings, in which.

DETAILED DESCRIPTION OF THE PREFERRED AND EXEMPLARY EMBODIMENTS

Figure 1:
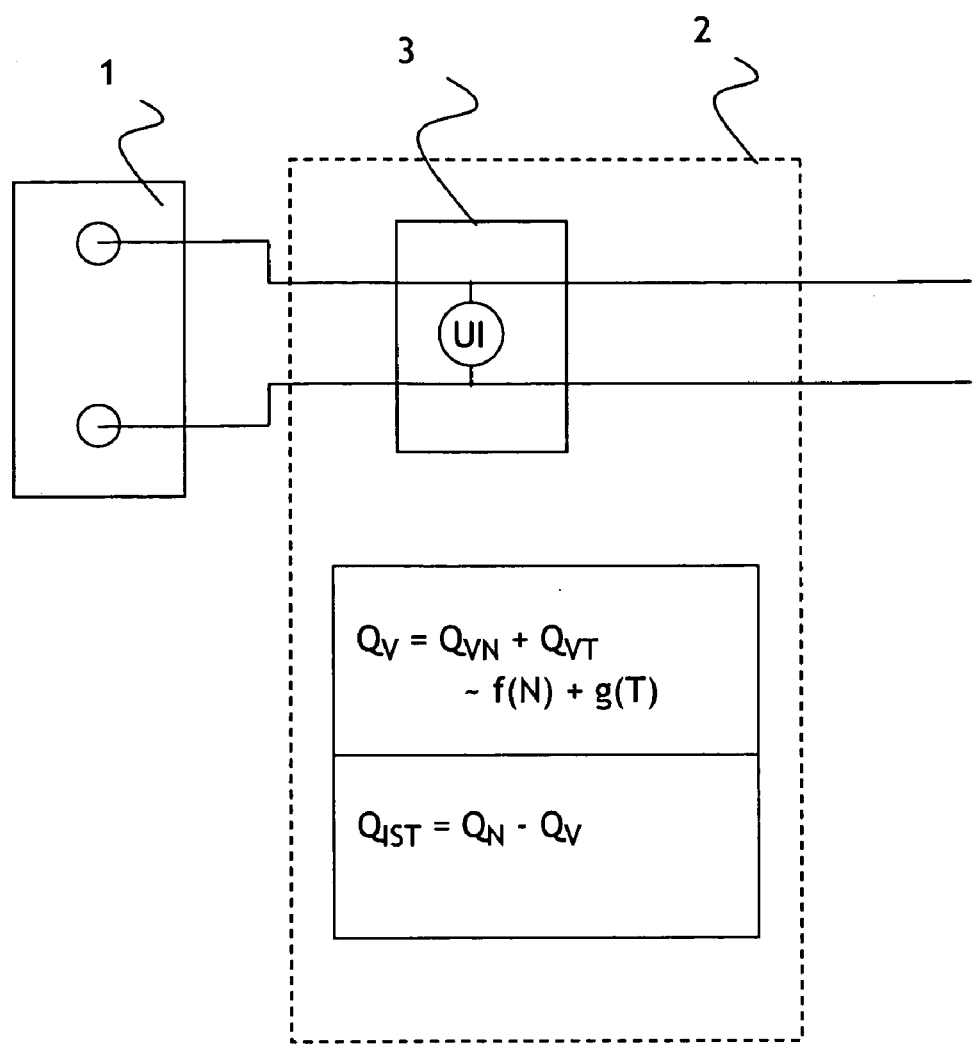
FIG. 1 shows a sketch of a storage battery with a monitoring device for measurement of the state of charge and for determining the wear according to the invention.

According to an exemplary embodiment, a method of determining the wear of a battery such as a storage battery (e.g., a lead-acid battery such as an automotive starting, lighting, and ignition battery; an industrial battery; a commercial battery, a marine battery, etc.) includes identifying deep discharge events when a state of charge value is less than a minimum state of charge value specified for that battery; determining the duration of the identified deep discharges; and determining a wear variable which characterizes the wear as a function of the total number and the total duration of the deep discharges which have been identified so far, with the wear variable increasing as the total number rises or increases and as the total duration rises or increases.

It has been found that the wear to a storage battery depends directly on the number and duration of the deep discharge events that have occurred in the past. A deep discharge occurs when, as a result of a discharge resulting from an external current or from self-discharge of the storage battery, a state of charge occurs which is deeper than, for example, the deepest state of charge specified by the manufacturer of the storage battery. A deep discharge such as this can lead to additional damage, which is caused by parasitic processes and reactions which, in a higher or permissible value range of the state of charge, do not take place or take place only at a very low rate, which is insignificant to the use of the storage battery. However, in a deep discharge state, these parasitic reactions do occur, and the reaction rates of these parasitic reactions increase to a disturbance variable, so that wear is caused.

According to an exemplary embodiment, the wear may be determined in a relatively simple manner by making use of the knowledge that the wear to a storage battery increases with the number of deep discharges (i.e., the number of discharge processes in which the state of charge falls below the deepest permissible state) and with the total duration of all of the deep discharges that have occurred so far.

It is particularly advantageous to determine the wear variable such that it increases more than proportionally with the total number of deep discharges. In this case, use is made of the further knowledge that the development of the wear in some cases takes place progressively, depending on the nature of the battery. The determination of the wear is in this case based on the phenomenon that a deep discharge that has occurred leads to greater wear the greater the total number of deep discharges that have already taken place. This exacerbating effect can be explained by previous damage to the storage battery from previous deep discharge events, leading to the parasitic reactions becoming stronger.

According to an exemplary embodiment, the wear variable is determined such that it increases more than proportionally with the total duration of the deep discharges. In this case, use is made of the fact that the wear increases with the total duration of the deep discharges (i.e., with the sum of the durations of all the deep discharges that have occurred). The duration of a deep discharge is the time duration during which the parasitic reactions occur. In this case, use is made of the knowledge that the development of wear takes place progressively depending on the type of storage battery, that is to say lengthening the total duration of the deep discharges can lead to greater wear, the longer the total duration of the previous deep discharges. This exacerbating effect can be explained by previous damage resulting from previous discharge periods, which lead to the parasitic reactions becoming stronger.

According to an exemplary embodiment, only those deep discharge events whose duration exceeds a defined minimum duration are assessed in order to add up the total number of deep discharges. Only selected deep discharges are therefore taken into account, these being those which, by virtue of their length, lead to initial damage to the battery.

According to an exemplary embodiment, the minimum duration is defined as a function of the ambient temperature or battery temperature. One advantageous feature of defining the minimum duration in this manner is that it has been found that the effect of deep discharges may in some circumstances be temperature-dependent. According to an exemplary embodiment, the minimum duration is in the range from about 0.1 to 100 hours.

The loss of storage capacity of the battery can be determined from the wear variable that has been determined in this manner. This may be done by determining the loss of storage capacity in proportion to the determined wear variable on the basis of a storage capacity at a previous defined time, preferably the storage capacity of the battery when the battery is new or unused.

According to other exemplary embodiments, instead of the loss of storage capacity, it is also possible to derive a change in some other characteristic variable from the wear variable.

According to an exemplary embodiment, a first wear component (which is dependent on the total number of identified deep discharges) with respect to the wear variable after a first deep discharge is preferably in the value range between 0.1% and 50%, and preferably between 1% and 20%, of the storage capacity of the storage battery at a previous defined time (preferably when the battery was new). The value of the first wear component after the first deep discharge at ambient temperatures or battery temperatures of about 20° C. is preferably in the range from 0.3% to 5%.

According to an exemplary embodiment, a second wear component (which is dependent on the total duration of the identified deep discharges) with respect to the wear variable preferably has a value, after a total duration of about 100 hours, of between 0.1% and 100%, and preferably between 0.1% and 20%, of the storage capacity of the storage battery at a previous defined time (preferably when the battery was new). At ambient temperatures or battery temperatures of about 20° C., the value of the second wear component after a total duration of about 100 hours is preferably in the range from 0.3% to 5%.

The stated values have been found to be suitable, especially for lead-acid rechargeable batteries.

According to an exemplary embodiment, the wear variable is determined from the sum of a first wear component (which is dependent on the total number of deep discharges) and a second wear component (which is dependent on the total duration of the deep discharges). In this case, the first wear component is calculated from a first function which behaves more than proportionally with the total number of deep discharges. The second wear component, on the other hand, is calculated from a second function, which behaves linearly or more than proportionally with the total duration of deep discharges. The wear variable is thus determined by taking account of the total number and total duration of deep discharges, independently of one another, by means of separate functions.

In order to carry out the method, a monitoring device for storage batteries is provided that includes a measurement unit for measurement of variables which characterize the state of charge of the storage battery. According to an exemplary embodiment, the monitoring unit has a programmable processor-assisted evaluation unit for determining the state of charge of the storage battery from the measured variables, and for determining the wear of the storage battery, and this evaluation unit is designed to carry out the method as described above. This can be carried out in a manner known to those skilled in the art, such as by programming or by the use of logic circuits.

A computer program may be provided that is embodied in the form of a product with program code means, with the program code means being designed to carry out the method described above when the computer program is run with the aid of a microprocessor. The programmed algorithm may, for example, be embodied on a floppy disk or as a program data stream in a data network, or the like.

FIG. 1 shows a sketch of a storage battery 1 which is monitored continuously by a monitoring device 2 throughout its entire life. In this case, the state of charge of the storage battery is measured continuously by means of a measurement unit 3, and checked to determine whether a deep discharge event is occurring. A deep discharge event occurs when the state of charge is below a minimum state of charge (e.g., such as a minimum state of charge specified by a manufacturer of the storage battery). In particular, the battery voltage is monitored and checked to determine whether the battery voltage falls below a defined minimum voltage in order to identify a deep discharge event.

The total number and the total duration of the deep discharge events which have already occurred during the life of the storage battery are then calculated, and are used to determine a wear variable. The wear to the storage battery 1 and the corresponding wear variable $Q_V$ increase as the total number N of identified deep discharges and the total duration T of deep discharges rise. The wear variable $Q_V$ can be calculated by adding a first wear component $Q_{VN}$ and a second wear component $Q_{VT}$, with the first wear component $Q_{VN}$ being calculated from a function f(N) which is dependent on the total number N of identified deep discharges. The second wear component $Q_{VT}$ is calculated from a second function g(T) as a function of the total duration of the identified deep discharges. The values of the functions f(N) and g(T) preferably rise as the number N and the duration T increase, that is to say, d f(N)/d N>0 and d g(T)/d T>0.

According to an exemplary embodiment, as the number N of deep discharges rises, the first wear component $Q_{VN}$ increases progressively. The function f(N) and its development after the total number N contains at least one term $N^x$ where x>1. The function may, for example, be represented as $f(N) \sim c_1 N^2$, where $c_1$ is a constant.

However, only those deep discharge events whose duration $\tau$ is greater than a defined minimum duration $\tau_{min}$, are included in the total number N. The defined minimum duration $\tau_{min}$ is preferably defined in the range between 0.1 and 100 hours. The minimum duration $\tau_{min}$ should be defined as a function of the ambient temperature or battery temperature, and is preferably chosen to be between 10 and 100 hours for an ambient temperature of about 20° C.

The second wear component $Q_{VT}$ with respect to the wear variable $Q_V$, which is dependent on the total duration T of the deep discharge events, is calculated by means of a function g(T), which increases linearly or progressively with the total duration T of deep discharge events identified during the life of the storage battery. The function g(T) and its development on the basis of the variable total duration T thus includes at least one term $T^Y$, where $Y \geq 1$. A function $g(T) \sim c_2 \cdot T$ where the constant $c_2$ has been found to be advantageous, and this function increases linearly with the total duration T.

The first and second wear components $Q_{VN}$, $Q_{VT}$ are calculated as a function of the battery temperature or ambient temperature. It is advantageous to normalize the first and second wear components $Q_{VN}$ and $Q_{VT}$ to a reference temperature (e.g., a room temperature of 20° C.). Using this reference temperature of 20° C., the value of the first wear component $Q_{VN}$ after the first deep discharge should be in the range from 0.3% to 5%. The second wear component $Q_{VT}$ should likewise have a value in the range from 0.3% to 5% at the reference temperature after a total duration T of 100 hours.

The evaluation unit 2 optionally has further means, in particular program code means, in order to use the wear variable $Q_V = Q_{VN} + Q_{VT}$ to determine the instantaneous storage capacity or else other properties which characterize the storage battery and which are subject to wear. For this purpose, if necessary, the wear variable $Q_V$ is multiplied by a factor subtracted from the initial capacity $Q_N$ of the storage battery when new:

$$Q_{act} = Q_N - c_3 Q_V$$

where $c_3$ is a constant proportionality factor. The wear variable $Q_V$ is thus a direct measure of the loss of storage capacity of the storage battery.

The method can be linked to further methods for determining wear, which may possibly take account of further physical effects that contribute to the wear of storage batteries other than deep discharging. The instantaneous storage capacity $Q_{act}$ is then calculated from the initial capacity $Q_N$ of the storage battery when new and from the linked wear variable $Q^*_v$ as follows:

$$Q_{act} = Q_N - c_4 \cdot Q^*_v$$

where $c_4$ is a constant proportionality factor.

It is important to note that the method and systems as described in the preferred and other exemplary embodiments is illustrative only. Although only a few embodiments of the present inventions have been described in detail in this disclosure, those skilled in the art who review this disclosure will readily appreciate that many modifications are possible without materially departing from the novel teachings and advantages of the subject matter recited herein. Other substitutions, modifications, changes and omissions may be made in the design, operating conditions and arrangement of the preferred and other exemplary embodiments without departing from the scope of the present inventions.

What is claimed is:

1. A method for determining the wear to a storage battery by monitoring the state of charge of the storage battery, the method comprising:
    identifying a plurality of deep discharge events when a state of charge value for the storage battery is less than a minimum state of charge value specified for the storage battery, wherein only those deep discharge events whose duration exceeds a defined minimum duration are assessed in order to determine the total number;
    determining the duration of the plurality of deep discharge events; and
    determining a wear variable which characterizes the wear as a function of the total number and the total duration of the plurality of deep discharge events;
    wherein the wear variable increases as the total number and the total duration of the deep discharge events increases.

2. The method of claim 1 wherein the wear variable is determined according to a function such that the wear variable increases non-linearly with and at a greater rate than the total number of deep discharge events.

3. The method of claim 1 wherein the wear variable is determined according to a function such that the wear variable increases non-linearly with and at a greater rate than the total duration of the deep discharge events.

4. The method of claim 1 wherein the defined minimum duration is defined as a function of at least one of the ambient temperature and the battery temperature.

5. The method of claim 1 wherein the defined minimum duration has a value of between approximately 0.1 and 100 hours at room temperature.

6. The method of claim 1 further comprising determining a loss of storage capacity for the storage battery in proportion to the wear variable on the basis of a storage capacity of the storage battery at a previous defined time.

7. The method of claim 6 wherein the storage capacity of the storage battery at the previous defined time is the storage capacity of the storage battery when the storage battery was new, and wherein the wear variable at the defined time is set to zero.

8. The method of claim 6 further comprising determining a first wear component that is dependent on the total number of identified deep discharge events.

9. The method of claim 8 wherein the first wear component has a value of between 0.1% and 50% of the storage capacity of the storage battery at the previous defined time after a first deep discharge event.

10. The method of claim 9 wherein the first wear component has a value of between 0.3% and 5% after the first deep discharge event at a battery temperature of approximately 20° C.

11. The method of claim 8 wherein the first wear component has a value of between 1% and 20% of the storage capacity of the storage battery at the previous defined time after a first deep discharge event.

12. The method of claim 11 wherein the first wear component has a value of between 0.3% and 5% after the first deep discharge event at a battery temperature of approximately 20° C.

13. The method of claim 8 further comprising determining a second wear component that is dependent on the total duration of the identified deep discharge events.

14. The method of claim 13 wherein the second wear component has a value of between 0.1% and 100% of the storage capacity of the storage battery at the previous defined time after a total duration of 100 hours.

15. The method of claim 14 wherein the second wear component has a value of between 0.3% and 5% after a total duration of 100 hours at battery temperatures in the region of 20° C.

16. The method of claim 13 wherein the second wear component has a value of between 0.1% and 20% of the storage capacity of the storage battery at the previous defined time after a total duration of 100 hours.

17. The method of claim 16 wherein the second wear component has a value of between 0.3% and 5% after a total duration of 100 hours at battery temperatures in the region of 20° C.

18. The method of claim 1 wherein the wear variable is determined from the sum of a first wear component that is dependent on the total number of deep discharge events and a second wear component that is dependent on the total duration of the deep discharge events.

19. The method of claim 18 wherein the first wear component is calculated from a first function that behaves linearly with regard to the total number of deep discharge events.

20. The method of claim 18 wherein the first wear component is calculated from a first function such that the first wear component increases non-linearly with an increasing total number of deep discharge events, the first wear component increasing at a rate greater than the total number of deep discharge events.

21. The method of claim 18 wherein and the second wear component is calculated from a second function that behaves linearly with regard to the total duration of deep discharge events.

22. The method of claim 18 wherein and the second wear component is calculated from a second function such that the second wear component increases non-linearly with an increasing total duration of deep discharge events, the second wear component increasing at a rate greater than the total number of deep discharge events.

23. A monitoring device for storage batteries comprising:
    a measurement unit for measuring variables which characterize the state of charge of the storage battery;
    an evaluation unit for determining the state of charge of the storage battery from the measured variables and for determining the wear of the storage battery using a method comprising:
    identifying a plurality of deep discharge events when a state of charge value for the storage battery is less than a minimum state of charge value specified for the storage battery, wherein only those deep discharge events whose duration exceeds a defined minimum duration are assessed in order to determine the total number;
    determining the duration of the plurality of deep discharge events; and
    determining a wear variable which characterizes the wear as a function of the total number and the total duration of the plurality of deep discharge events;
    wherein the wear variable increases as the total number and the total duration of the deep discharge events increases.

24. A computer program comprising:

program code means;

wherein the program code means are designed to carry out a method comprising:

identifying a plurality of deep discharge events when a state of charge value for the storage battery is less than a minimum state of charge value specified for the storage battery, wherein only those deep discharge events whose duration exceeds a defined minimum duration are assessed in order to determine the total number;

determining the duration of the plurality of deep discharge events; and determining a wear variable which characterizes the wear as a function of the total number and the total duration of the plurality of deep discharge events;

wherein the wear variable increases as the total number and the total duration of the deep discharge events increases.

* * * * *